(12) United States Patent
Yamada et al.

(10) Patent No.: US 9,053,994 B2
(45) Date of Patent: Jun. 9, 2015

(54) IMAGE PICKUP UNIT AND IMAGE PICKUP DISPLAY SYSTEM

(71) Applicant: Sony Corporation, Tokyo (JP)

(72) Inventors: Yasuhiro Yamada, Kanagawa (JP); Makoto Takatoku, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 51 days.

(21) Appl. No.: 13/864,631

(22) Filed: Apr. 17, 2013

(65) Prior Publication Data
US 2013/0313621 A1   Nov. 28, 2013

(30) Foreign Application Priority Data

May 28, 2012 (JP) ................................. 2012-120551

(51) Int. Cl.
*H01L 31/062* (2012.01)
*H01L 27/146* (2006.01)

(52) U.S. Cl.
CPC ........ *H01L 27/146* (2013.01); *H01L 27/14614* (2013.01); *H01L 27/14658* (2013.01)

(58) Field of Classification Search
CPC .................................................. H01L 27/14614
USPC .......................................... 257/292, 365, 366
See application file for complete search history.

(56) References Cited

U.S. PATENT DOCUMENTS 7,750,422 B2 * 7/2010 Watanabe et al. ............. 257/431

FOREIGN PATENT DOCUMENTS

| JP | 2004-265935 | 9/2004 |
| JP | 2008-252074 | 10/2008 |

* cited by examiner

*Primary Examiner* — Mark Prenty
(74) *Attorney, Agent, or Firm* — Dentons US LLP

(57) ABSTRACT

A device for image sensing includes a photoelectric conversion unit and at least one transistor. The photoelectric conversion unit is configured to convert incident electromagnetic radiation into an electric signal. The at least one transistor includes a first gate electrode and a second gate electrode above the first gate electrode. The first gate electrode and the second gate electrode do not overlap each other within a non-overlapping region.

10 Claims, 18 Drawing Sheets

IMAGE PICKUP UNIT AND IMAGE PICKUP DISPLAY SYSTEM

BACKGROUND

The present disclosure relates to an image sensing device suitable for use in X-ray photography for medical and non-destructive inspection applications for example, and a display system using such an image sensing device.

In recent years, an image pickup unit such as a human chest X-ray photography unit has been developed that derives radiation-based images as electric signals without any intervention of radiographic films. In such an image pickup unit, a field-effect thin-film transistor (TFT) for reading out accumulated signal charges is arranged on each pixel, and electric signals based on the amount of radiation are derived using a pixel circuit including this transistor.

As such a transistor, a transistor employing a single-gate structure such as so-called top-gate type or bottom-gate type has been commonly used. For the above-described image pickup unit that derives radiation-based images, however, it is known that especially when a silicon oxide film is used for a gate insulating film of a transistor, a threshold voltage (Vth) is shifted to a negative-side due to a radiation effect (for example, see Japanese Unexamined Patent Application Publication No. 2008-252074).

Accordingly, a transistor has been proposed that alleviates any shift in a threshold voltage as described above by adopting a so-called dual-gate structure (double-sided gate structure) in which two gate electrodes are provided with a semiconductor layer interposed between (for example, see Japanese Unexamined Patent Application Publication No. 2004-265935).

SUMMARY

However, for a transistor of a dual-gate structure as described in Japanese Unexamined Patent Application Publication No. 2004-265935, as compared with a transistor of a general-type single-gate structure, it is likely that a leakage current may arise in switching from a turn-on operation to a turn-off operation, resulting in a so-called shot noise being generated easily. There is a disadvantage that the image quality may deteriorate due to such a noise effect.

It is desirable to provide an image sensing device that makes it possible to achieve enhancement of the quality in sensing images, and a display system including such an image sensing device.

A device for image sensing according to an embodiment of the present disclosure includes a photoelectric conversion unit and at least one transistor. The photoelectric conversion unit is configured to convert incident electromagnetic radiation into an electric signal. The at least one transistor includes a first gate electrode and a second gate electrode above the first gate electrode. The first gate electrode and the second gate electrode do not overlap each other within a non-overlapping region.

A system for display according to an embodiment of the present disclosure is provided with a display unit configured to display an image based on a signal obtained by an image sensing device and the image sensing device including a plurality of pixels. Each of the plurality of pixels includes a photoelectric conversion unit and at least one a transistor including a first gate electrode and a second gate electrode above the first gate electrode. The first gate electrode and the second gate electrode do not overlap each other within a non-overlapping region.

In the image sensing device and the display system according to the above-described respective embodiments of the present disclosure, a field-effect transistor that is provided along with the photoelectric conversion unit of each of the pixels has the first gate electrode and the second gate electrode that are provided with a semiconductor layer interposed between. The transistor includes the non-overlapping region where the first gate electrode and the second gate electrode do not overlap each other. As a result, this reduces a capacitance between the first gate electrode and the second gate electrode (gate overlapping capacitance), and suppresses a leakage current arising in switching from a turn-on operation to a turn-off operation of the transistor.

According to the image sensing device and the display system of the above-described respective embodiments of the present disclosure, the non-overlapping region where the first gate electrode and the second gate electrode do not overlap each other is provided in the field-effect transistor that is provided along with the photoelectric conversion unit of each of the pixels. This allows to suppress a leakage current arising in switching from a turn-on operation to a turn-off operation of the transistor, as well as to alleviate any effect of a shot noise. As a result, this makes it possible to achieve enhancement of the quality in pickup images.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

FIG. 18A is a schematic diagram showing a simplified configuration of an image pickup section according to a modification example 4-1, while

DETAILED DESCRIPTION

Hereinafter, some embodiments of the present disclosure are described in details with reference to the drawings. It is to be noted that the descriptions are provided in the order given below.
1. Embodiment (example of an image pickup unit with a non-overlapping region provided at an end of a drain side on a channel layer)
2. Modification Examples 1-1 to 1-4 (other examples of a non-overlapping region)
3. Modification Example 2 (example where a design is performed to make a difference in a gate-channel capacitance between a top side and a bottom side of a channel layer)
4. Modification Examples 3-1 and 3-2 (other examples of a passive-type pixel circuit)
5. Modification Examples 3-3 and 3-4 (examples of an active-type pixel circuit)
6. Modification Examples 4-1 and 4-2 (examples of an indirect conversion-type image pickup unit and a direct conversion-type image pickup unit)
7. Application Example (example of an image pickup display system)

Embodiment

Configuration

Figure 1:
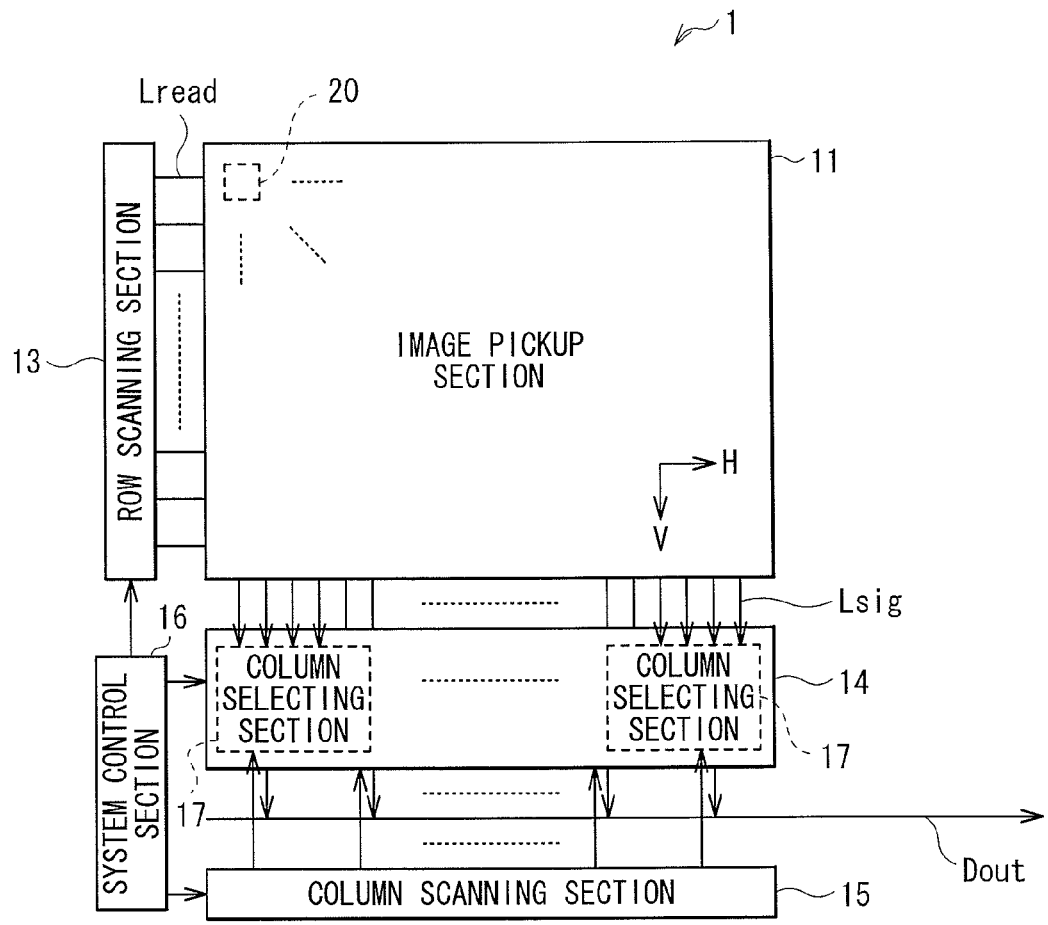
FIG. 1 is a schematic block diagram showing an example of an overall configuration of an image pickup unit according to an embodiment of the present disclosure.

FIG. 1 shows an overall block configuration of an image pickup unit (image pickup unit 1) according to an embodiment of the present disclosure. The image pickup unit 1 reads information on a subject (takes an image of a subject) on the basis of incident light (image pickup light). The image pickup unit 1 may include an image pickup section 11, a row scanning section 13, an A/D conversion section 14, a column scanning section 15, and a system control section 16.
(Image Pickup Section 11)

The image pickup section 11 generates electrical signals depending on incident light (image pickup light). On the image pickup section 11, pixels (image pickup pixels, unit pixels) 20 may be arranged two-dimensionally in a row-column pattern (matrix pattern), and each of the pixels 20 has a photoelectric conversion device (later-described photoelectric conversion device 21) that generates a photoelectric charge of the charge amount corresponding to the amount of the image pickup light to accumulate the resulting photoelectric charge internally. It is to be noted that the descriptions are provided hereinafter in such a manner that a horizontal direction (row direction) within the image pickup section 11 is referred to as an "H" direction, and a vertical direction (column direction) is referred to as a "V" direction as shown in FIG. 1.

Figure 2:
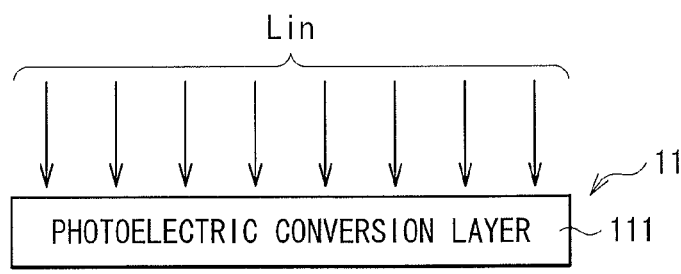
FIG. 2 is a schematic diagram showing an example of a simplified configuration of an image pickup section illustrated in FIG. 1.

FIG. 2 shows an example of a simplified configuration of the image pickup section 11. The image pickup section 11 may have a photoelectric conversion layer 111 with a photoelectric conversion device 21 arranged thereon for each of the pixels 20. On the photoelectric conversion layer 111, as shown in the figure, a photoelectric conversion (conversion from image pickup light Lin into a signal charge) on the basis of the incident image pickup light Lin is carried out.

Figure 3:
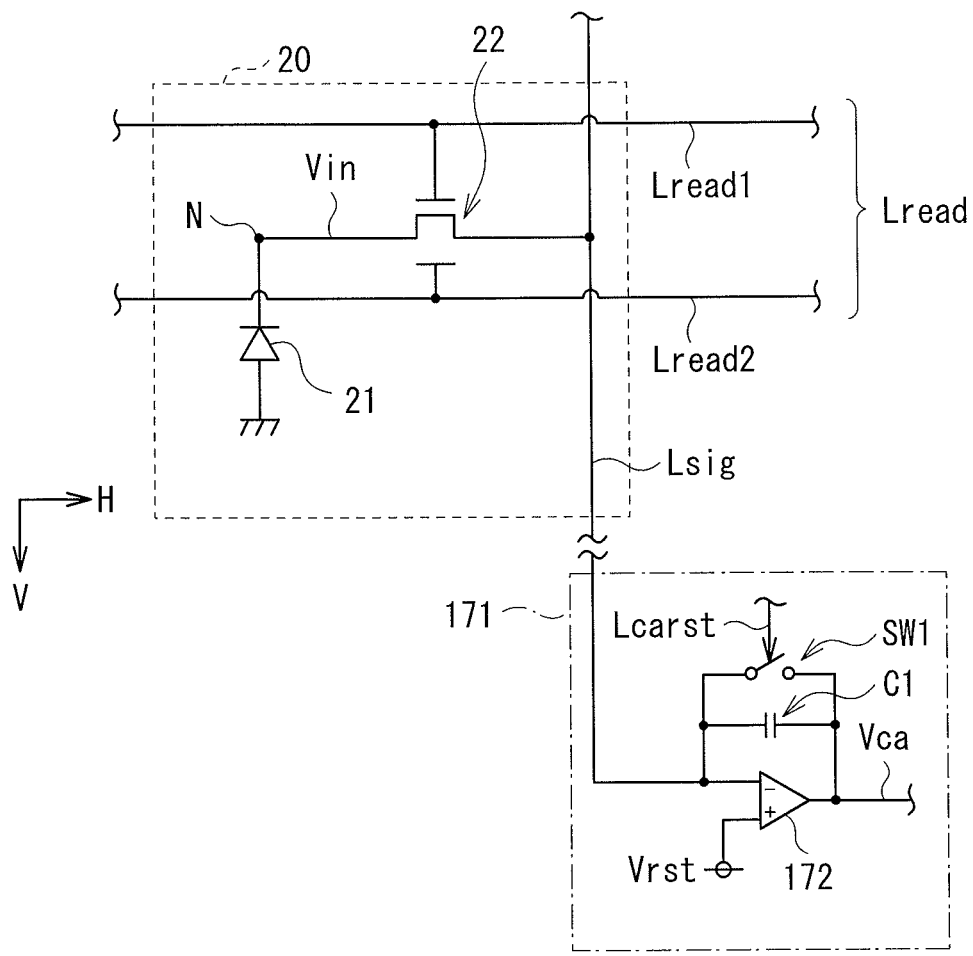
FIG. 3 is a circuit diagram showing an example of a detailed configuration of a pixel, etc., illustrated in FIG. 1.

FIG. 3 shows with an example a circuit configuration of the pixel 20 (so-called passive-type circuit configuration) along with a circuit configuration of a later-described charge amplifier circuit 171 within the A/D conversion section 14. On this passive-type pixel 20, there may be provided a single photoelectric conversion device 21 and a single transistor 22. Further, a readout control line Lread extending along the H direction and a signal line Lsig extending along the V direction are also connected with this pixel 20.

The photoelectric conversion device 21, which may be composed of a PIN (Positive Intrinsic Negative) type photodiode or an MIS (Metal-Insulator-Semiconductor) type sensor for example, generates a signal charge of the charge amount corresponding to the amount of the incident light (image pickup light Lin) as described above. It is to be noted that a cathode of the photoelectric conversion device 21 may be connected with an accumulation node N in this case.

The transistor 22 is a transistor (readout transistor) that turns on depending on a row scanning signal provided from the readout control line Lread, thereby outputting a signal charge (input voltage Vin) derived by the photoelectric conversion device 21 to the signal line Lsig. The transistor 22 may be composed of an N-channel type (N-type) field-effect transistor (FET) in this case. However, the transistor 22 may be alternatively composed of any other elements such as a P-channel type (P-type) FET. On the pixel 20, a gate of the transistor 22 may be connected with the readout control line Lread, and a source (or drain) may be connected with the signal line Lsig for example, while a drain (or source) may be connected with the cathode of the photoelectric conversion device 21 via the accumulation node N for example. Further, an anode of the photoelectric conversion device 21 may be connected with a ground (grounded) in this case. A specific cross-sectional configuration of the transistor 22 is described later.

The row scanning section 13, which may include a later-described shift register circuit, a predefined logic circuit, etc., is a pixel driving section (row scanning circuit) that performs a driving in a unit of row (unit of horizontal line) (line sequential scanning) for the plurality of pixels 20 within the image pickup section 11. In concrete terms, the row scanning section 13 may perform an image pickup operation such as a later-described readout operation through a line sequential scanning for example. It is to be noted that such a line sequential scanning may be carried out by providing the above-described row scanning signal to each of the pixels 20 via the readout control line Lread.

The A/D conversion section 14 may have a plurality of column selecting sections 17 that may be provided one-by-one for each of the plurality of signal lines Lsig (four lines in the example), and carries out an A/D conversion (analog-to-digital conversion) based on signal voltages (signal charges) incoming via the signal lines Lsig. This generates output data Dout (image pickup signal) in the form of a digital signal that is output to the outside.

Each of the column selecting sections 17 may have a charge amplifier circuit 171 including a charge amplifier 172, a capacitor device (such as capacitor and feedback capacitor device) C1, and a switch SW1 as shown in an example in FIG. 3, as well as a sample/hold (S/H) circuit, a multiplexer circuit (selection circuit), and an A/D converter that are not shown in the figure.

The charge amplifier 172 is an amplifier for converting a signal charge that is read out from the signal line Lsig into a voltage (Q-V conversion). On the charge amplifier 172, one end of the signal line Lsig is connected with a negative-side (minus-side) input terminal, while a predetermined reset voltage Vrst is input to a positive-side (plus-side) input terminal. Between an output terminal and the negative-side input terminal of the charge amplifier 172, a feedback connection is made through a parallel connection circuit of the capacitor device C1 and the switch SW1. In other words, a first terminal of the capacitor device C1 is connected with the negative-side input terminal of the charge amplifier 172, while a second terminal is connected with the output terminal of the charge amplifier 172. Similarly, a first terminal of the switch SW1 is connected with the negative-side input terminal of the charge amplifier 172, while a second terminal is connected with the output terminal of the charge amplifier 172. It is to be noted that on-off state of the switch SW1 is controlled by the use of a control signal (amplifier reset control signal) that is provided from the system control section 16 via an amplifier reset control line Lcarst.

The column scanning section 15, which may include, for example, a shift register, an address decoder, etc., that are not shown in the figure, scans to drive each of the column selecting sections 17 in sequence. Through such a selective scanning performed by the column scanning section 15, a signal for each of the pixels 20 that is read out via each signal line Lsig (above-described output data Dout) is output to the outside in sequence.

The system control section 16 controls operation of the row scanning section 13, the A/D conversion section 14, and the column scanning section 15. In concrete terms, the system control section 16 has a timing generator to generate various timing signals (control signals), and carries out a driving control of the row scanning section 13, the A/D conversion section 14, and the column scanning section 15 on the basis of timing signals generated by this timing generator. Under control of the system control section 16, each of the row scanning section 13, the A/D conversion section 14, and the column scanning section 15 performs an image pickup driving (line sequential image pickup driving) for each of the pixels 20, thereby obtaining the output data Dout from the image pickup section 11.

(Detailed Configuration of Transistor 22)

Figure 4:
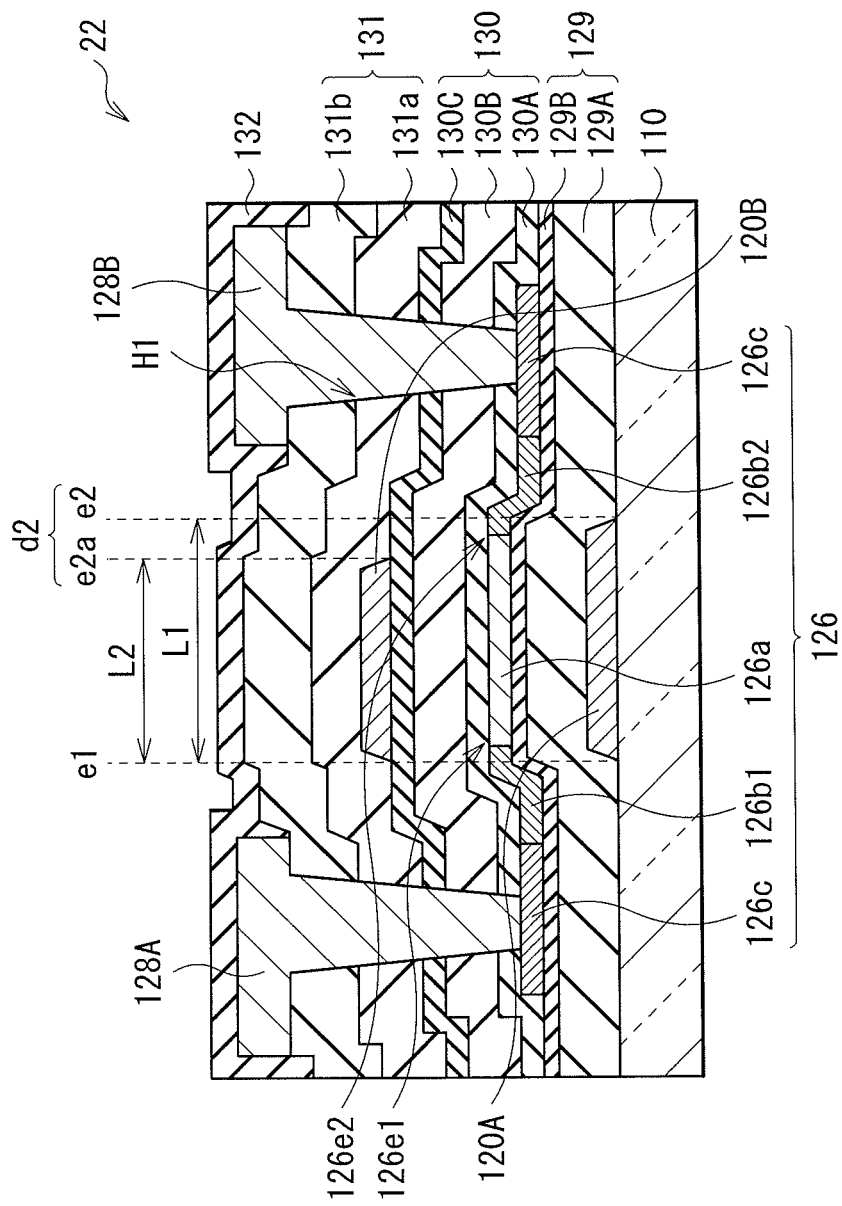
FIG. 4 is a cross-sectional diagram showing an example of a detailed configuration of a transistor illustrated in FIG. 3.

FIG. 4 shows an example of a cross-sectional configuration for the transistor 22. The transistor 22 has a so-called dual-gate type structure in which two gates (gate electrode 120A and gate electrode 120B) are provided with a semiconductor layer (semiconductor layer 126) interposed between. It is to be noted that the gate electrode 120A corresponds to a specific but not limitative example of a "first gate electrode" in one embodiment of the present disclosure, while the gate electrode 120B corresponds to a specific but not limitative example of a "second gate electrode" in one embodiment of the present disclosure.

On a substrate 110, the transistor 22 has the gate electrode 120A, and may have a first gate insulating film 129 that is formed to cover the gate electrode 120A. On the first gate insulating film 129, there is provided a semiconductor layer 126, and a second gate insulating film 130 may be formed to cover the semiconductor layer 126. At a region in opposition to the gate electrode 120A on the second gate insulating film 130, there is arranged the gate electrode 120B. On the gate electrode 120B, a first interlayer insulating film 131 having a contact hole H1 may be formed, and a source electrode 128A and a drain electrode 128B may be formed to fill in this contact hole H1. On the first interlayer insulating film 131, the source electrode 128A, and the drain electrode 128B, there may be provided a protective film 132.

Each of the gate electrodes 120A and 120B may be a single-layer film composed of any one of elements such as titanium (Ti), aluminum (Al), molybdenum (Mo), tungsten (W), and chromium (Cr), or a multilayer film composed of two or more of such elements, for example. As descried above, the gate electrodes 120A and 120B may be provided in opposition to one another with the first gate insulating film 129, the semiconductor layer 126, and the second gate insulating film 130 interposed between.

Out of these gate electrodes, the gate electrode 120A is connected with a readout control line Lread1, while the gate electrode 120B is connected with a readout control line Lread2. A source (source electrode 128A) of the transistor 22 may be connected with a cathode of the photoelectric conversion device 21 via the accumulation node N for example, and a drain (drain electrode 128B) may be connected with the signal line Lsig for example. Further, an anode of the photoelectric conversion device 21 may be connected with a ground (grounded) in this case.

Each of the first gate insulating film 129 and the second gate insulating film 130 may be a single-layer film such as a silicon oxide film (SiOx) and a silicon oxynitride film (SiON), or a multilayer film having such a silicon compound film and a silicon nitride film (SiNx). For example, the first gate insulating film 129 may have a configuration in which a silicon nitride film 129A and a silicon oxide film 129B are laminated in this order from the substrate 110 side, while the second gate insulating film 130 may have a configuration in which a silicon oxide film 130A, a silicon nitride film 130B, and a silicon oxide film 130C are laminated in this order from the substrate 110 side. In one embodiment where a low-temperature polycrystalline silicon (LTPS) is used for the semiconductor layer 126, as described above, a layer structure may be adopted that laminates silicon oxide films on the first gate insulating film 129 and the second gate insulating film 130.

In this embodiment of the present disclosure, in the first gate insulating film 129 and the second gate insulating film 130, factors such as a multilayer structure and a film thickness of each layer which may be composed of the above-described silicon compounds are designed to ensure that a capacitance arising between each of the gate electrodes 120A and 120B and a channel layer 126a becomes equivalent.

The semiconductor layer 126 may be composed of, for example, a low-temperature polycrystalline silicon (LTPS). However, a constituent material thereof is not limited thereto, and the semiconductor layer 126 may be alternatively composed using a silicon-based semiconductor such as amorphous silicon, microcrystalline silicon, and polycrystalline silicon (polysilicon). As an alternative, use of an oxide semiconductor such as indium gallium zinc oxide (InGaZnO) and zinc oxide (ZnO) may be permitted. The semiconductor layer 126 includes at least a channel layer. In this embodiment of the present disclosure, in the semiconductor layer 126, LDD (Lightly-Doped Drain) layers 126b1 and 126b2 may be formed between a channel layer 126a and an N+ layer 126c that act as active layers. In concrete terms, the LDD layer 126b1 may be provided adjacent to an end 126e1 (first end) of the source electrode 128A side (hereinafter referred to as simply a "source side") of the channel layer 126a. The LDD layer 126b2 may be provided adjacent to an end 126e2 (second end) of the drain electrode 128B side (hereinafter referred to as simply a "drain side") of the channel layer 126a.

Each of the source electrode 128A and the drain electrode 128B may be a single-layer film composed of any one of elements such as Ti, Al, Mo, W, and Cr, or a multilayer film composed of two or more of such elements, for example. Each of the source electrode 128A and the drain electrode 128B may be formed adjacent to the N+ layer 126c via the contact hole H1, being electrically connected with this semiconductor layer 126.

Each of the first interlayer insulating film 131 and the protective film 132 may be composed of a single-layer film such as a silicon oxide film, a silicon oxynitride film, and a silicon nitride film, or a multilayer film laminating any combination of such films, for example. For example, the first interlayer insulating film 131 may have a configuration in which a silicon oxide film 131a and a silicon nitride film 131b are laminated in this order from the substrate 110 side, while the protective film 132 may be composed of a silicon oxide film.

Figure 5:
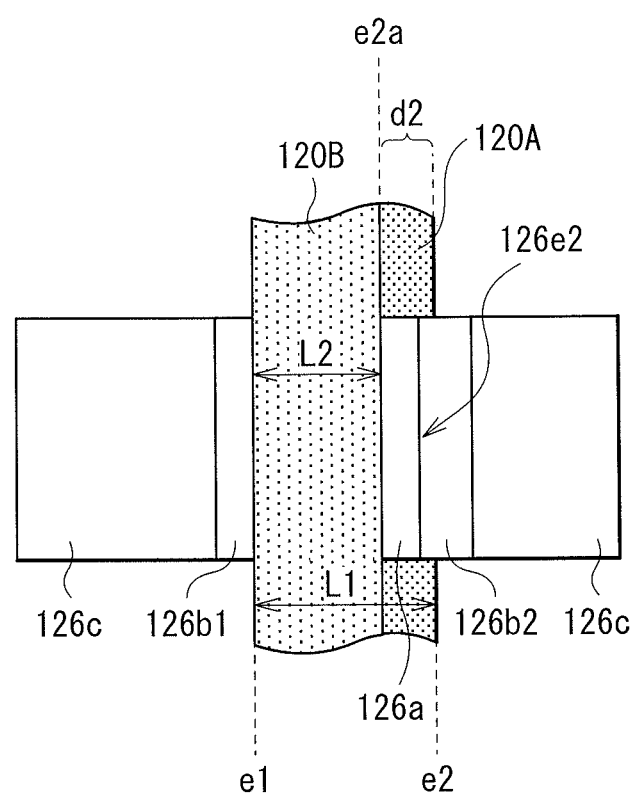
FIG. 5 is a schematic diagram showing an example of a planar configuration of the transistor illustrated in FIG. 4.

As described above, the transistor 22 according to this embodiment of the present disclosure includes the gate electrodes 120A and 120B that are arranged in opposition to one another with the semiconductor layer 126 interposed between, and has a region where the gate electrodes 120A and 120B are not overlapped with one another in part (non-overlapping region d2). FIG. 5 shows an example of a planar (plane parallel to a substrate surface) layout configuration of the gate electrodes 120A and 120B as well as the semiconductor layer 126 (channel layer 126a, LDD layers 126b1 and 126b2, and N+ layer 126c).

The non-overlapping region d2 may be provided at a region corresponding to either or both of the end 126e1 of the source side and the end 126e2 of the drain side on the channel layer 126a. Here, as described above, in a configuration where the LDD layers 126b1 and 126b2 are provided adjacent to both ends 126e1 and 126e2 on the channel layer 126a, the non-overlapping region d2 may be formed only at a region corresponding to the end 126e2 on the channel layer 126a. In other words, the end 126e1 on the channel layer 126a may be provided between the gate electrodes 120A and 120B (at a region corresponding to the end 126e1, the gate electrodes 120A and 120B are provided to be overlapped with one another). On the other hand, the end 126e2 on the channel layer 126a may be provided to be exposed from the gate electrodes 120A or 120B (the gate electrode 120B in this case).

In concrete terms, the ends of the source sides on the gate electrodes 120A and 120B may be provided, for example, at almost the same position as the end 126e1 on the channel layer 126a or at a position e1 outward from this position. On the other hand, the end of the drain side on the gate electrode 120A may be provided, for example, at almost the same position as the end 126e2 on the channel layer 126a or at a position e2 outward from this position, while the end of the drain side on the gate electrode 120B may be provided, for example, at a position e2a inward from the end 126e2 on the channel layer 126a. In this manner, in this embodiment of the present disclosure, the gate electrodes 120A and 120B may differ in width (gate length L) from one another (L1>L2).

[Operation and Advantageous Effects]

In the image pickup unit 1 according to this embodiment of the present disclosure, when the image pickup light Lin comes into the image pickup section 11, the photoelectric conversion device 21 within each of the pixels 20 converts the image pickup light Lin into a signal charge (photoelectric conversion). At this time, on the accumulation node N, a voltage variation depending on a node capacitance occurs due to accumulation of signal charges generated by the photoelectric conversion. In concrete terms, if an accumulation node capacitance is Cs, and a generated signal charge is q, a voltage varies (decreases in this case) by a value of (q/Cs) on the accumulation node N. In response to such a voltage variation, a voltage corresponding to a signal charge is applied to the drain of the transistor 22. Subsequently, when the transistor 22 turns on in response to a row scanning signal provided from the readout control line Lread (Lread1 and Lread2), the signal charge accumulated on the accumulation node N (voltage corresponding to the above-described signal charge to be applied to the drain of the transistor 22) is read out of the pixels 20 to the signal line Lsig.

The signal charge that is read out is input to the column selecting sections 17 within the A/D conversion section 14 for each of a plurality of pixel columns (four pixel columns in this case) via the signal lines Lsig. On the column selecting section 17, the charge amplifier circuit 171 performs Q-V conversion (signal charge-to-signal voltage conversion) for each of the signal charges incoming from each signal line Lsig followed by the A/D conversion processing, etc., thereby generating the output data Dout (image pickup signal) in the form of a digital signal. In such a way, the output data Dout is output in sequence from each of the column selecting sections 17, and then is transmitted to the outside (or is input to an internal memory that is not shown in the figure).

It is known that especially when radiation ray is used as the image pickup light Lin, the transistor characteristics deteriorate due to radiation leakage into a transistor. For example, especially for a transistor using a low-temperature polysilicon, it is necessary to interpose a semiconductor layer between silicon oxide films, although radiation incidence into such oxygen-contained films excites electrons present in the films due to a so-called photoelectric effect, Compton scattering, electron-pair creation, etc. As a result, electron holes are trapped in any interface or flaw to remain intact (to be charged), causing a threshold voltage of a transistor to be shifted to a negative side. Accordingly, for suppressing such a shift in the threshold voltage, like this embodiment of the present disclosure, it is preferable to adopt a dual-gate structure where the gate electrodes 120A and 120B are provided with the semiconductor layer interposed between.

When the dual-gate structure is used, however, switching of the transistor 22 from a turn-on operation to a turn-off operation in reading out signal charges may generate a dynamic leakage current (transient current). As a cause thereof, any capacitance (gate overlapping capacitance and channel capacitance) arises between the gate electrodes 120A and 120B, resulting in charges (for example, electrons) being accumulated. At the time of a turn-off operation, charges (for example, electron holes) flow in from both sides of source and drain, and thus electrons accumulated between the gate electrodes 120A and 120B flow out of both sides of source and drain. This is a phenomenon called a charge injection, which causes generation of a shot noise and deterioration of the pickup image quality.

In this embodiment of the present disclosure, the transistor 22 has the non-overlapping region d2 at which the gate electrodes 120A and 120B are not overlapped with one another in part in a structure where the gate electrodes 120A and 120B are arranged in opposition to one another with the semiconductor layer 126 interposed between. Provision of such a non-overlapping region d2 achieves an effect of suppressing any shift in the threshold voltage that may be caused especially by radiation irradiation in the dual-gate structure as described above, while reducing a gate overlapping capacitance. This reduces a leakage current, and suppresses generation of a shot noise.

As described, in this embodiment of the present disclosure, the transistor 22 that is provided along with the photoelectric conversion device 21 on each of the pixels 20 includes the gate electrodes 120A and 120B with the semiconductor layer 126 interposed between, and has the non-overlapping region d2 at which the gate electrodes 120A and 120B are not overlapped with one another in part. This allows to suppress a leakage current arising in switching from a turn-on operation to a turn-off operation of the transistor, as well as to alleviate any effect of a shot noise. As a result, this makes it possible to achieve enhancement of the quality in pickup images.

Next, the descriptions are provided on modification examples (modification examples 1-1 to 1-4, 2, 3-1 to 3-4, 4-1, and 4-2) of the above-described embodiment of the present disclosure. It is to be noted that any component parts essentially same as the above-described embodiment of the present disclosure are denoted with the same reference numerals, and the related descriptions are omitted as appropriate.

Modification Example 1-1

Figure 6:
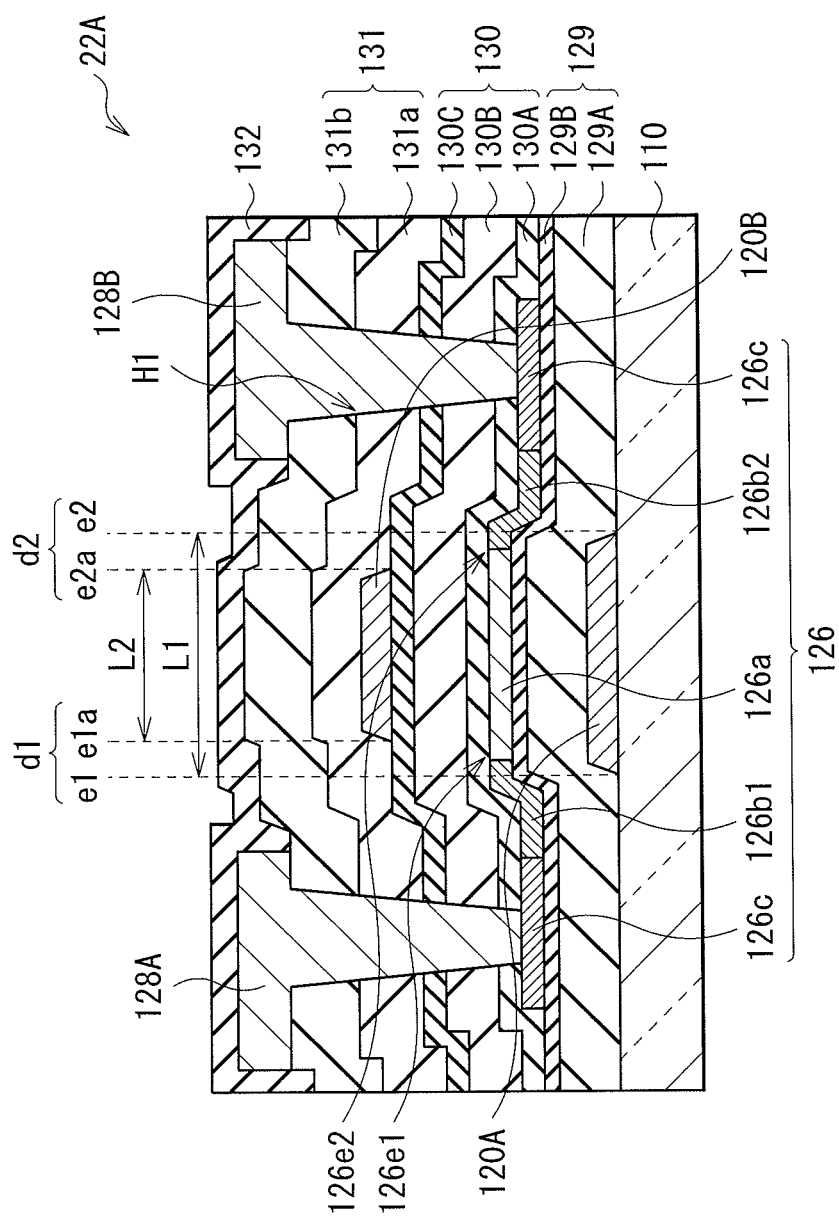
FIG. 6 is a cross-sectional diagram showing an example of a detailed configuration of a transistor according to a modification example 1-1.

FIG. 6 shows a cross-sectional structure of a transistor (transistor 22A) according to a modification example 1-1. As with the transistor 22 according to the above-described embodiment of the present disclosure, the transistor 22A is provided along with the photoelectric conversion device 21 on each of the pixels 20 in the image pickup section 11 of the above-described image pickup unit 1. On the transistor 22A according to this modification example as well, the gate electrodes 120A and 120B are arranged in opposition to one another with the semiconductor layer 126 interposed between, and the LDD layers 126b1 and 126b2 may be formed adjacent to both ends 126e1 and 126e2 of the source side and drain side of the channel layer 126a on the semiconductor layer 126. In such a configuration, as with the above-described embodiment of the present disclosure, the transistor 22A may have the non-overlapping region d2 corresponding to the end 126e2 of the drain side on the channel layer 126a.

Figure 7:
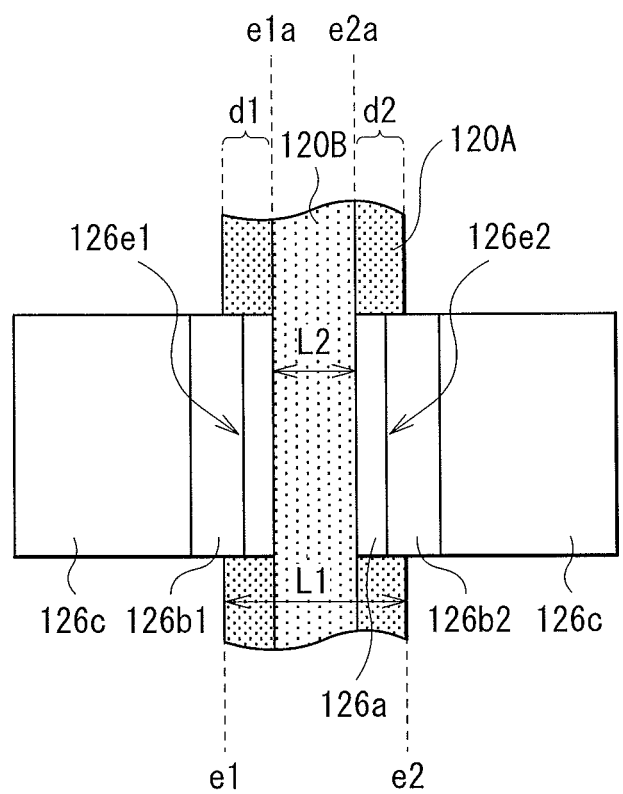
FIG. 7 is a schematic diagram showing an example of a planar configuration of the transistor illustrated in FIG. 6.

However, the transistor 22A according to this modification example also has a non-overlapping region (non-overlapping region d1) at a region corresponding to the end 126e1 of the source side on the channel layer 126a as well. That is, the non-overlapping regions d1 and d2 are provided at regions corresponding to both ends 126e1 and 126e2 on the channel layer 126a. FIG. 7 shows an example of a planar layout configuration for the gate electrodes 120A and 120B, as well as the semiconductor layer 126 (channel layer 126a, LDD layers 126b1 and 126b2, and N+ layer 126c) in this modification example. As seen from the figure, both ends 126e1 and 126e2 on the channel layer 126a may be provided to be exposed from the gate electrodes 120A or 120B (the gate electrode 120B in the figure).

In concrete terms, both ends of the source side and the drain side on the gate electrode 120B may be provided, for example, at positions e1a and e2a inward from the ends 126e1 and 126e2 on the channel layer 126a. On the other hand, both ends of the source side and drain side on the gate electrode 120A may be provided, for example, at almost the same position as the ends 126e1 and 126e2 on the channel layer 126a or at positions e1 and e2 outward from these positions.

Because of such a configuration, in this embodiment of the present disclosure as well, the gate electrodes 120A and 120B may differ in width (gate length L) from one another (L1>L2).

As described above, the non-overlapping regions d1 and d2 are not limited to the drain side on the channel layer 126a, but may be alternatively provided at both ends 126e1 and 126e2 of the source side and drain side. Even in such a case, as with the above-described embodiment of the present disclosure, it is possible to reduce a gate overlapping capacitance, and to suppress any effect of a shot noise. As a result, this allows the effect equivalent to the above-described embodiment of the present disclosure to be achieved.

Modification Example 1-2

Figure 8:
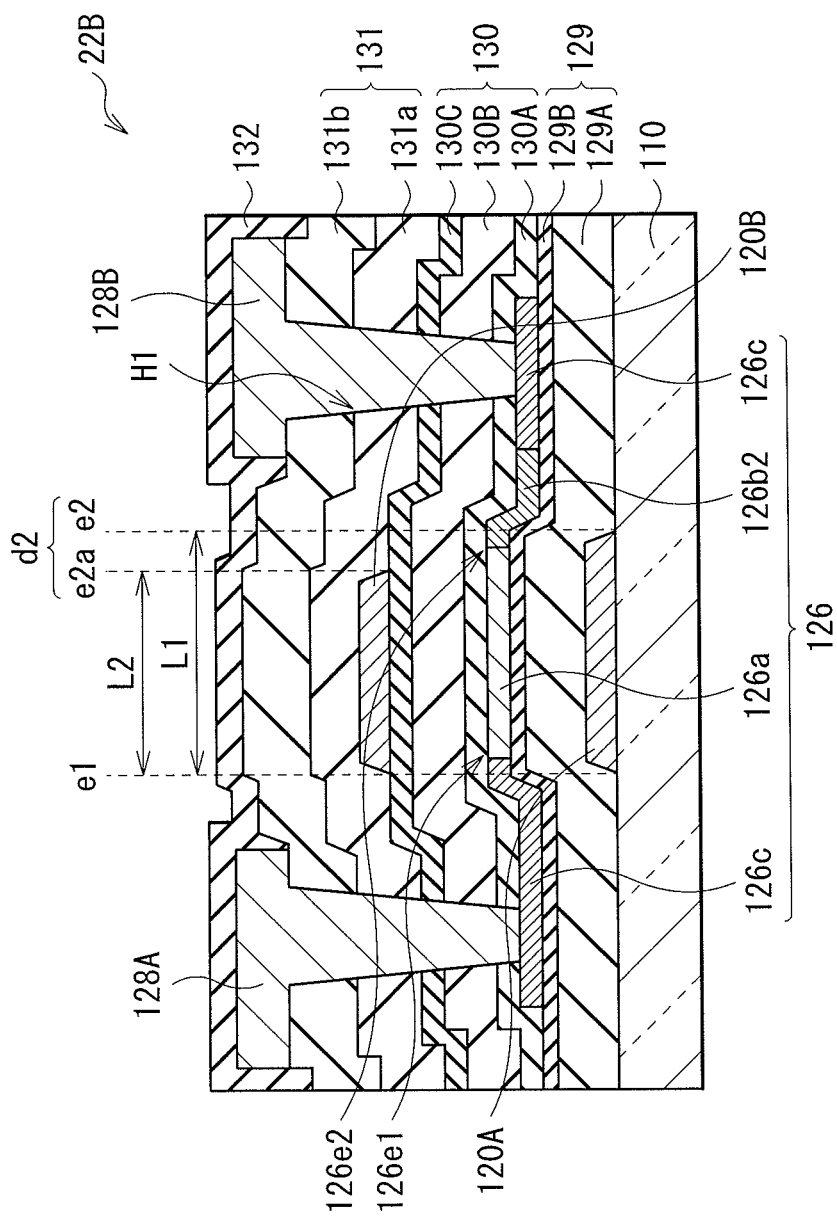
FIG. 8 is a cross-sectional diagram showing an example of a detailed configuration of a transistor according to a modification example 1-2.

FIG. 8 shows a cross-sectional structure of a transistor (transistor 22B) according to a modification example 1-2. As with the transistor 22 according to the above-described embodiment of the present disclosure, the transistor 22B is provided along with the photoelectric conversion device 21 on each of the pixels 20 in the image pickup section 11 of the above-described image pickup unit 1. On the transistor 22B according to this modification example as well, the gate electrodes 120A and 120B are arranged in opposition to one another with the semiconductor layer 126 interposed between. Further, as with the above-described embodiment of the present disclosure, the transistor 22B may have the non-overlapping region d2 corresponding to the end 126e2 of the drain side on the channel layer 126a.

Figure 9:
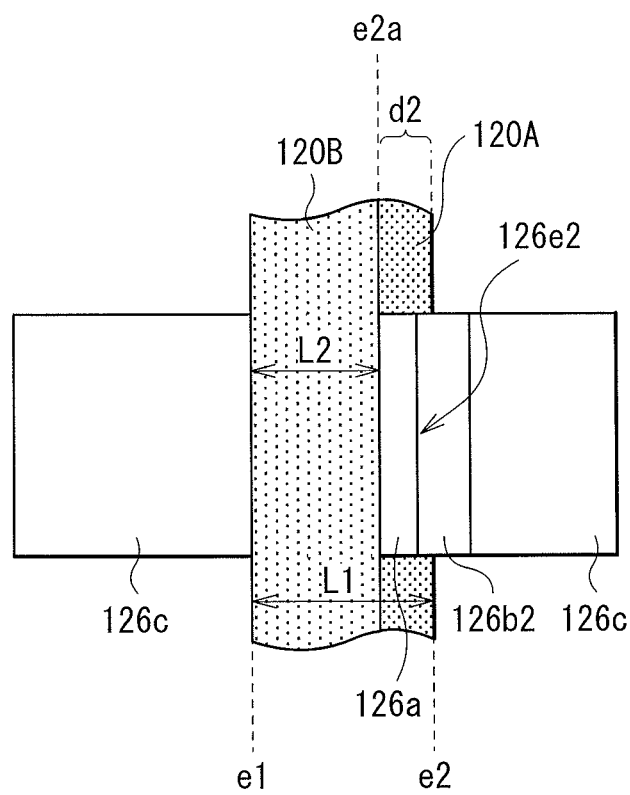
FIG. 9 is a schematic diagram showing an example of a planar configuration of the transistor illustrated in FIG. 8.

However, in the transistor 22B according to this modification example, on the semiconductor layer 126, the LDD layer 126b2 is formed adjacent to only the end 126e2 of the drain side on the channel layer 126a. FIG. 9 shows an example of a planar layout configuration for the gate electrodes 120A and 120B, as well as the semiconductor layer 126 (channel layer 126a, LDD layers 126b1 and 126b2, and N+ layer 126c) in this modification example. As seen from the figure, only the end 126e2 adjacent to the LDD layer 126b2 may be provided to be exposed from the gate electrodes 120A or 120B (the gate electrode 120B in the figure). Excepting that the LDD layer 126b1 is not formed, the configuration is the same as the above-described embodiment of the present disclosure.

As described above, on the semiconductor layer 126, for example, a structure where the LDD layer 126b2 is provided at only the drain side on the channel layer 126a may be also permitted alternatively. Also in this case, it is possible to achieve the effect equivalent to the above-described embodiment of the present disclosure by providing the non-overlapping region d2 at a region corresponding to the end 126e2 of the drain side on the channel layer 126a for example.

Modification Example 1-3

Figure 10:
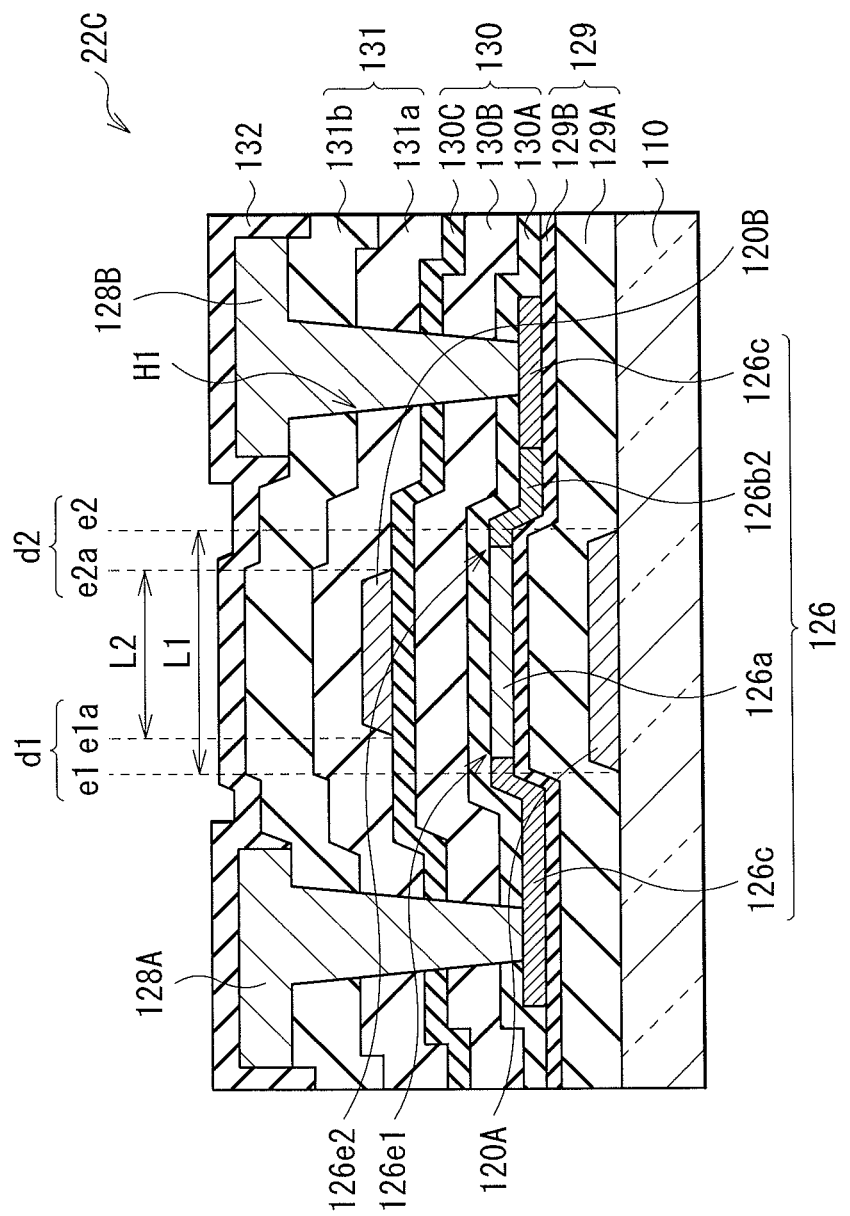
FIG. 10 is a cross-sectional diagram showing an example of a detailed configuration of a transistor according to a modification example 1-3.
Figure 11:
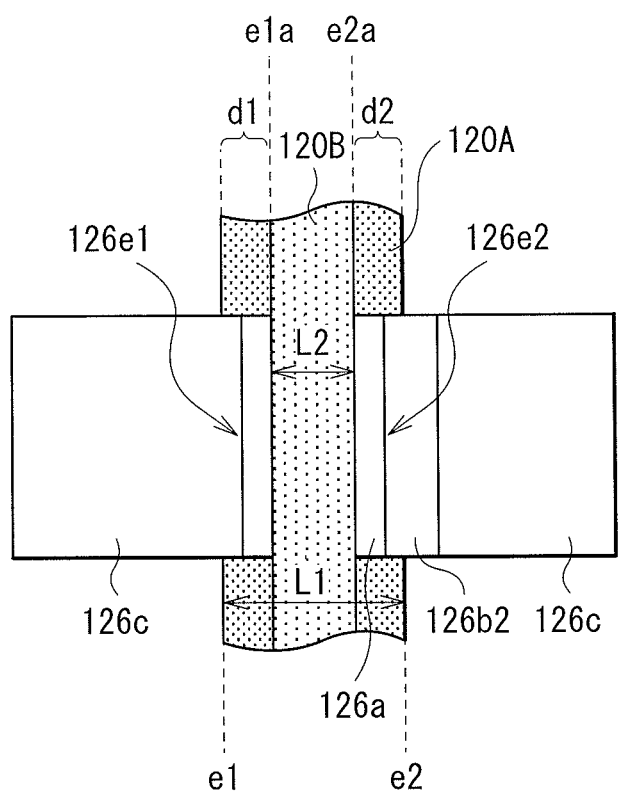
FIG. 11 is a schematic diagram showing an example of a planar configuration of the transistor illustrated in FIG. 10.

FIG. 10 shows a cross-sectional structure of a transistor (transistor 22C) according to a modification example 1-3. FIG. 11 shows an example of a planar layout configuration for the gate electrodes 120A and 120B, as well as the semiconductor layer 126 (channel layer 126a, LDD layers 126b1 and 126b2, and N+ layer 126c) in this modification example. In the above-described modification example 1-2, the description is provided on the configuration where the LDD layer 126b2 is provided at only the drain side on the channel layer 126a, although the non-overlapping regions d1 and d2 may be provided at regions corresponding to both ends 126e1 and 126e2 on the channel layer 126a as with the above-described modification example 1-1. Also in such a case, it is possible to achieve the effect equivalent to the above-described embodiment of the present disclosure.

Modification Example 1-4

Figure 12:
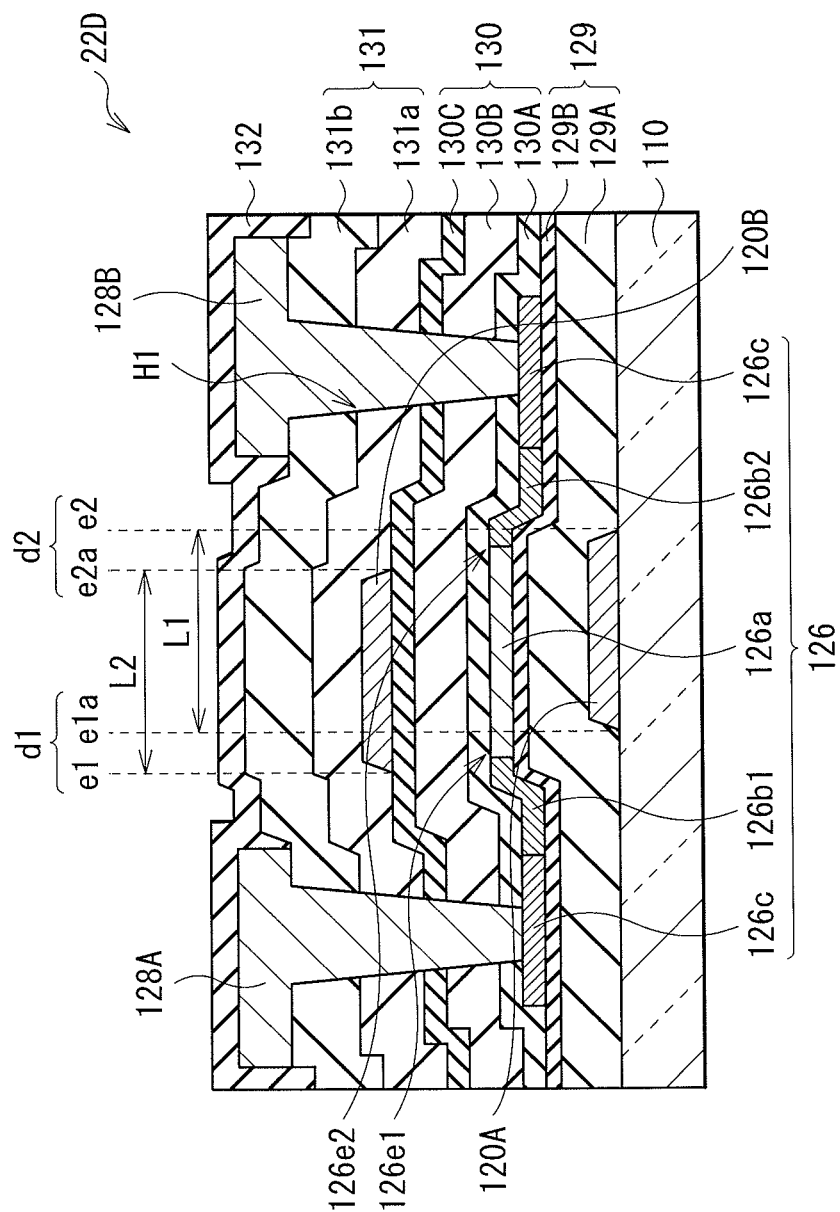
FIG. 12 is a cross-sectional diagram showing an example of a detailed configuration of a transistor according to a modification example 1-4.
Figure 13:
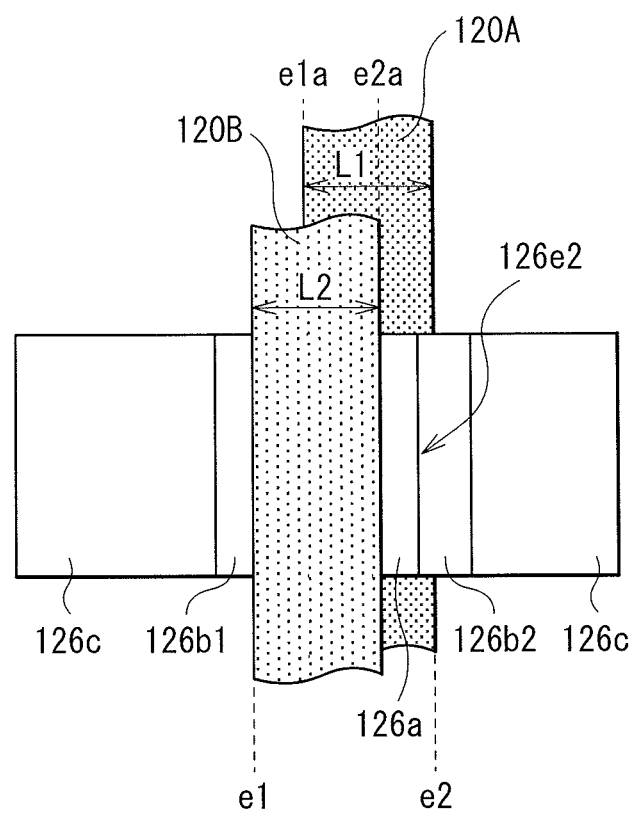
FIG. 13 is a schematic diagram showing an example of a planar configuration of the transistor illustrated in FIG. 12.

FIG. 12 shows a cross-sectional structure of a transistor (transistor 22D) according to a modification example 1-4. FIG. 13 shows an example of a planar layout configuration for the gate electrodes 120A and 120B, as well as the semiconductor layer 126 (channel layer 126a, LDD layers 126b1 and 126b2, and N+ layer 126c) in this modification example. Like this modification example, in a structure where the non-overlapping regions d1 and d2 are provided at both ends 126e1 and 126e2 on the channel layer 126a, the end 126e1 on the channel layer 126a may be exposed from the gate electrode 120A at the non-overlapping region d1, while the end 126e2 may be exposed from the gate electrode 120B at the non-overlapping region d2. Alternatively, on the contrary, the end 126e1 on the channel layer 126a may be exposed from the gate electrode 120B, while the other end 126e2 may be exposed from the gate electrode 120A. In this modification example, each width of the gate electrodes 120A and 120B may be identical to one another, or different from one another. Such a configuration also makes it possible to reduce a gate overlapping capacitance and achieve the effect equivalent to the above-described embodiment of the present disclosure. It is to be noted that a structure for each of the gate electrodes 120A and 120B according to this modification example is also applicable to the structure where the LDD layer 126b2 is provided at only the drain side of the channel layer 126a on the semiconductor layer 126 like the above-described modification example 1-2.

Modification Example 2

Further, in the above-described embodiment of the present disclosure, the description is provided on a case where each capacitance arising between each of the gate electrodes 120A and 120B and the channel layer 126a becomes equivalent to each other, although these capacitances may be different from each other. In this case, a difference in capacitance is made between a top side and a bottom side of the channel layer 126a by appropriately adjusting factors such as multilayer structures and film thicknesses of silicon compound films on the first gate insulating film 129 and the second gate insulating film 130.

For example, it is preferable to make a capacitance between the gate electrode 120B and the channel layer 126a smaller than a capacitance between the gate electrode 120A and the channel layer 126a, by setting a thickness of the second gate insulating film 130 to be greater than a thickness of the first gate insulating film 129. Here, the top surface of the channel layer 126a (interface between the channel layer 126a and the second gate insulating film 130) is susceptible to contamination, resulting in an interface state being easily generated. This is caused due to the following reason. That is, for example, when a low-temperature polysilicon is used for the channel layer 126a, since the first gate insulating film 129 arranged as an lower layer and the semiconductor layer (α-Si; H) acting as the channel layer 126a are allowed to be formed continuously in vacuum, it is less likely that an interface between the first gate insulating film 129 and the channel layer 126a may be susceptible to contamination, and it is easy to hold an interface state in an optimal state. On the other hand, the second gate insulating film 130 is formed following a crystallization process of the channel layer 126a (for example, laser annealing process such as ELA). Consequently, the top surface of the channel layer 126a is once exposed in the air prior to formation of the second gate insulating film 130, and thus an interface at the second gate insulating film 130 side on the channel layer 126a is more susceptible to contamination than an interface at the first gate insulating film 129 side. For such a reason, it is advantageous for reduction of a shot noise as described above to decrease a capacitance at an upper layer part of the channel layer 126a in particular.

It is to be noted that making a capacitance of a top side (second gate insulating film 130 side) smaller than a capacitance of a bottom side (first gate insulating film 129 side) like the above-described configuration is illustrative and not limitative. A capacitance of the bottom side may be made smaller than that of the top side on the channel layer 126a. However, as described above, an interface at the top side on the channel layer 126a is susceptible to contamination, and thus it is preferable to make a capacitance of the top side smaller than that of the bottom side.

Modification Example 3-1

Figure 14:
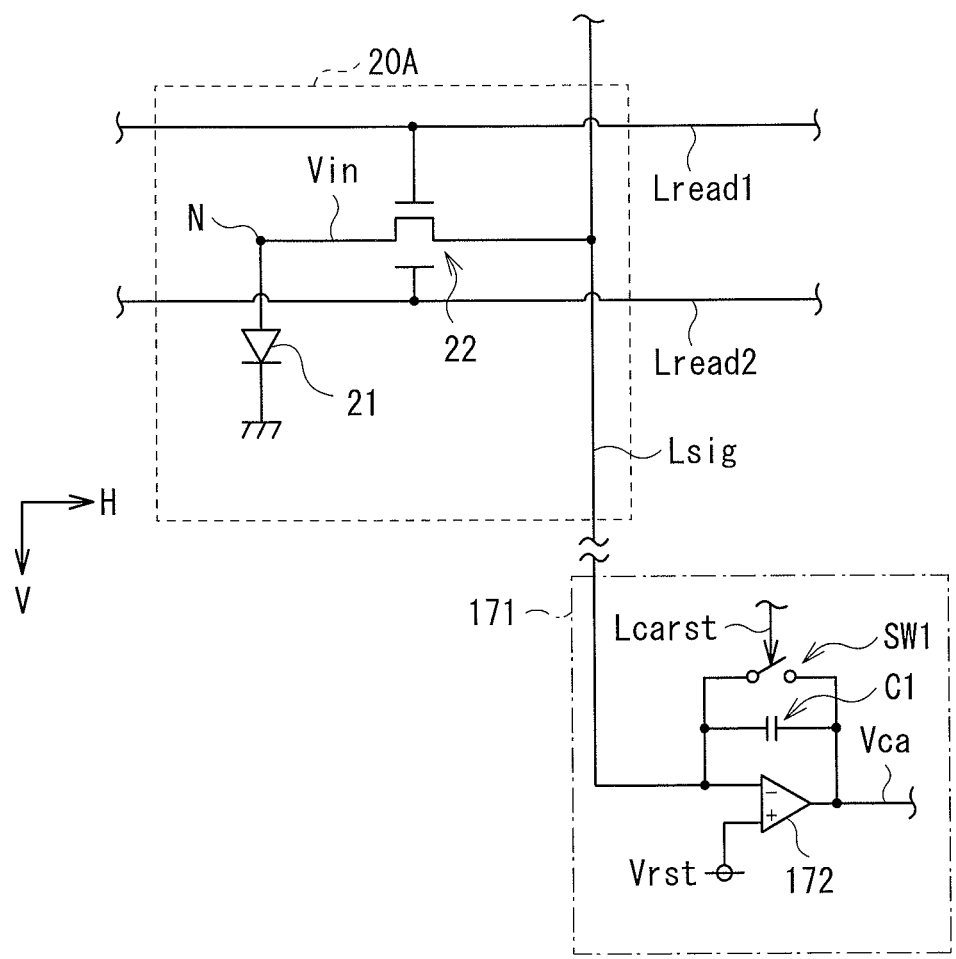
FIG. 14 is a circuit diagram showing a configuration of a pixel, etc., according to a modification example 3-1.

FIG. 14 shows a circuit configuration of a pixel (pixel 20A) according to a modification example 3-1 along with a circuit configuration example of a charge amplifier circuit 171. As with the pixel 20 according to the above-described embodiments of the present disclosure, the pixel 20A includes a passive-type pixel circuit, and may have one photoelectric conversion device 21 and one transistor 22. Further, the readout control line Lread (Lread1 and Lread2) and the signal line Lsig are connected with the pixel 20A.

On the pixel 20A according to this modification example, however, unlike the pixel 20 according to the above-described embodiments of the present disclosure, an anode of the photoelectric conversion device 21 is connected with the accumulation node N, while a cathode thereof is connected with a power supply terminal. In this manner, the accumulation node N may be connected with the anode of the photoelectric conversion device 21 on the pixel 20A, and even in this case it is possible to achieve the same advantageous effect as the image pickup unit 1 according to the above-described embodiment of the present disclosure.

Modification Example 3-2

Figure 15:
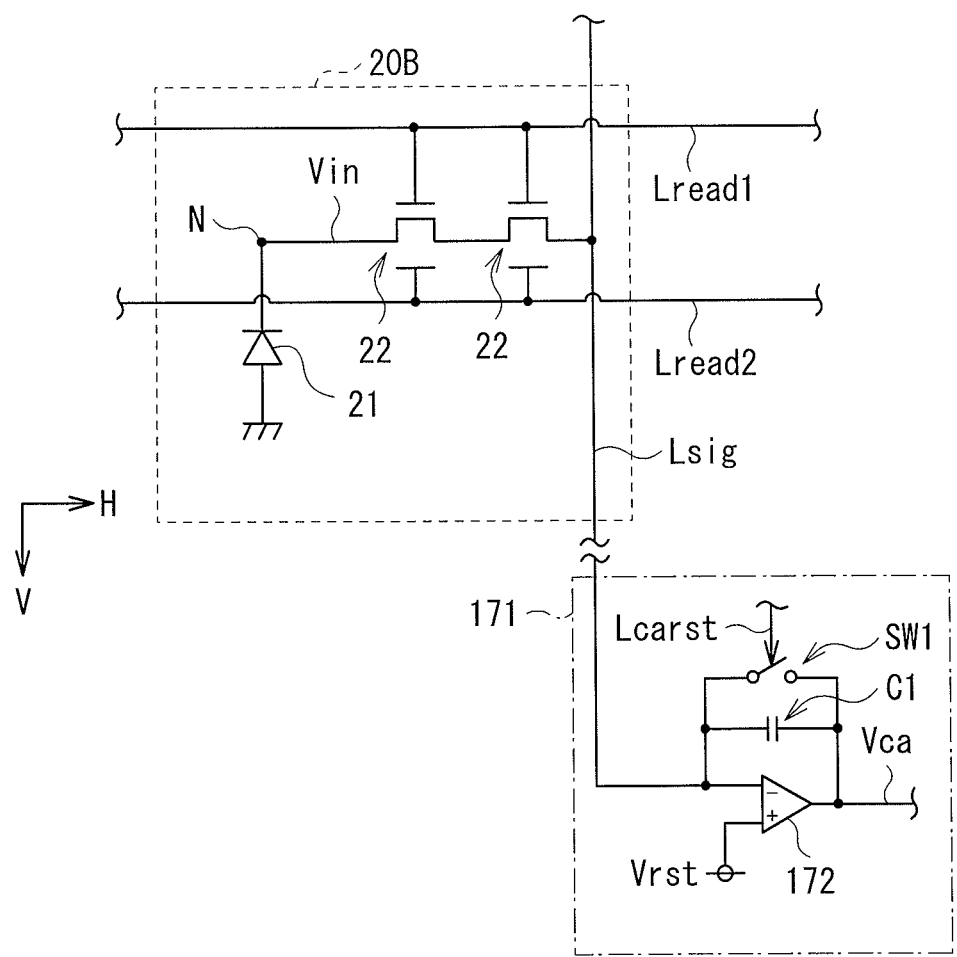
FIG. 15 is a circuit diagram showing a configuration of a pixel, etc., according to a modification example 3-2.

FIG. 15 shows a circuit configuration of a pixel (pixel 20B) according to a modification example 3-2 along with a circuit configuration example of the charge amplifier circuit 171. As with the pixel 20 according to the above-described embodiments of the present disclosure, the pixel 20B adopts a passive-type pixel circuit configuration, being connected with the readout control line Lread (Lread1 and Lread2) and the signal line Lsig.

In this modification example, however, the pixel 20B has one photoelectric conversion device 21 and two transistors 22. These two transistors 22 are connected with one another serially (a source or drain of one of them is electrically connected with a source or drain of the other of them). Further, a gate on each of the transistors 22 is connected with the readout control line Lread.

In this manner, a configuration where two transistors 22 that are connected serially are provided within the pixel 20B may be adopted, and even in this case it is possible to achieve the same advantageous effect as the above-described embodiment of the present disclosure.

Modification Examples 3-3 and 3-4

Figure 16:
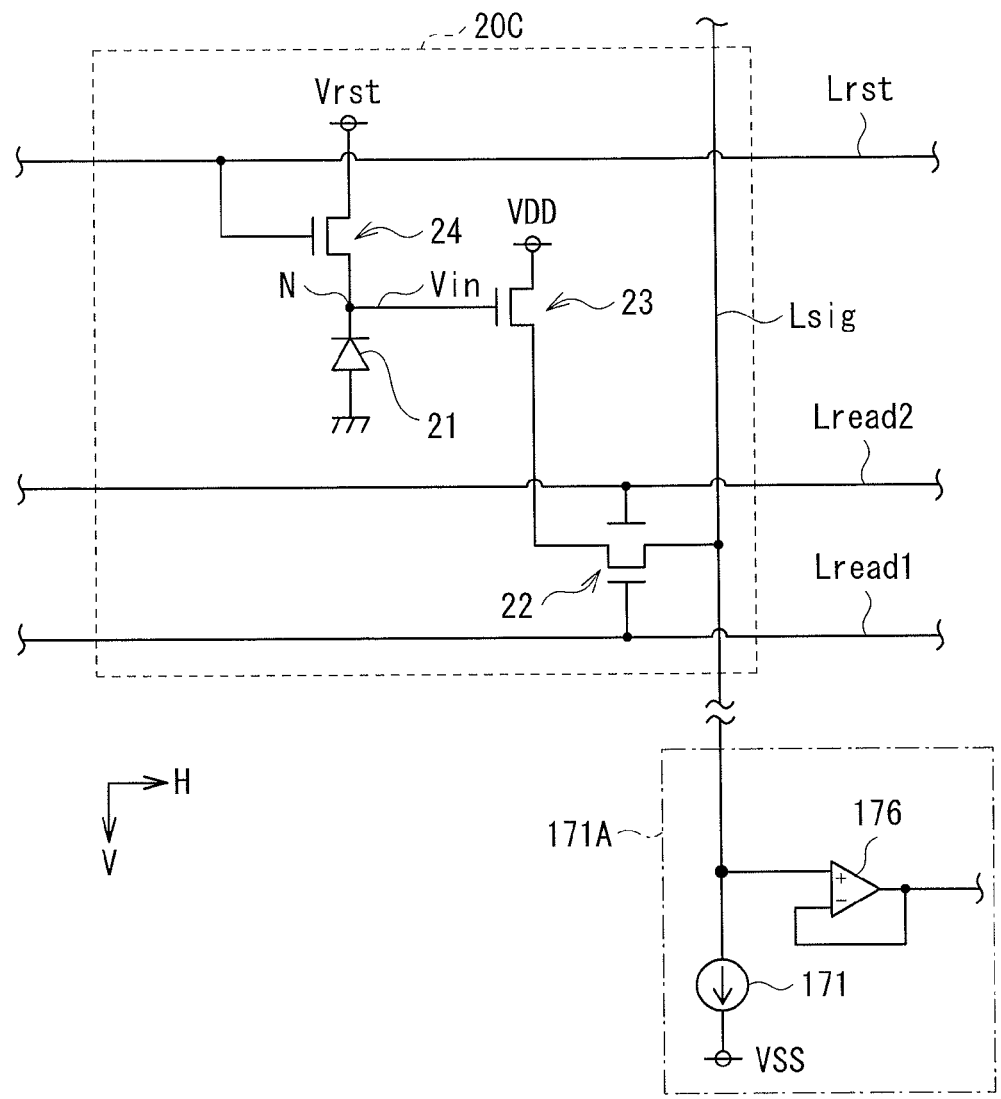
FIG. 16 is a circuit diagram showing a configuration of a pixel, etc., according to a modification example 3-3.
Figure 17:
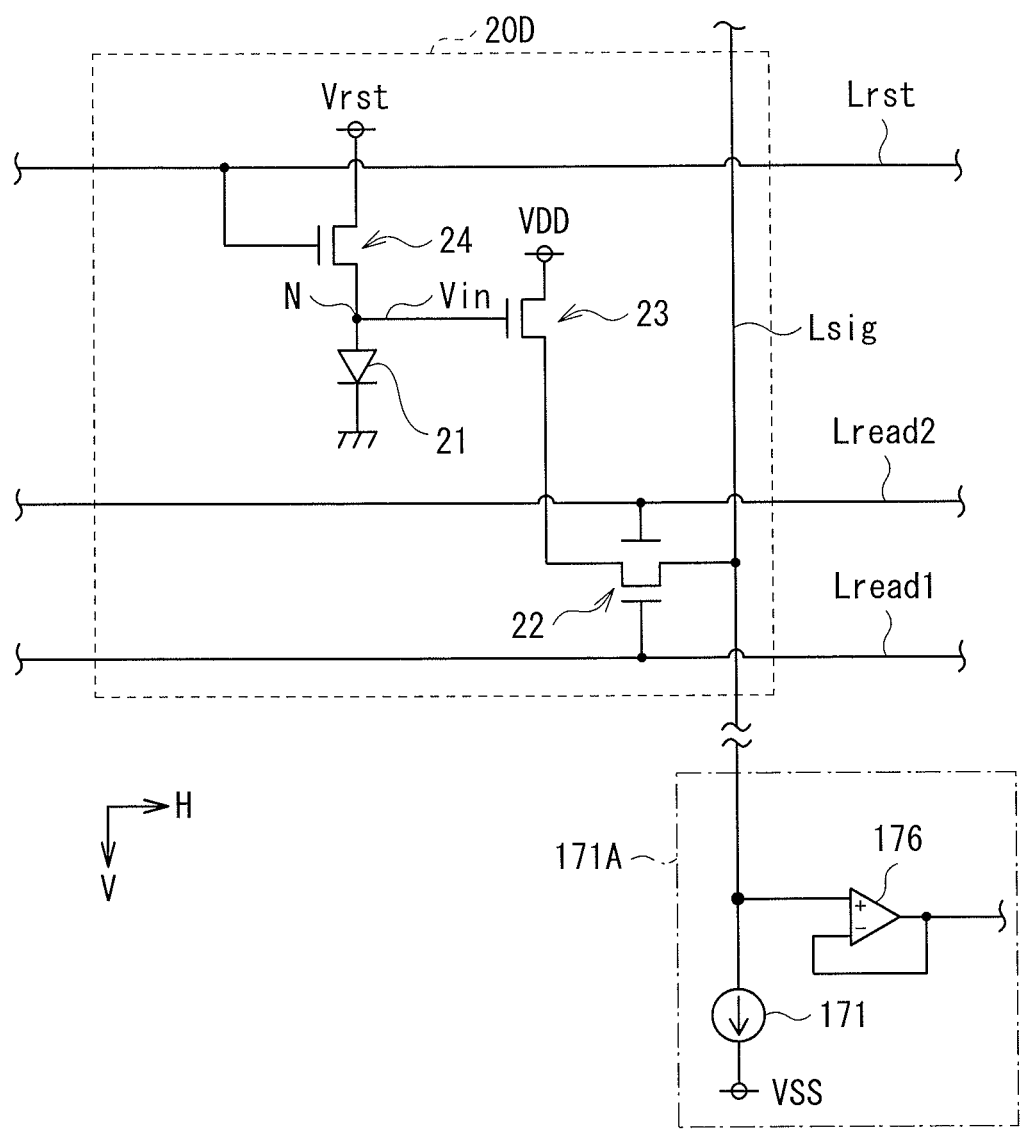
FIG. 17 is a circuit diagram showing a configuration of a pixel, etc., according to a modification example 3-4.

FIG. 16 shows a circuit configuration of a pixel (pixel 20C) according to a modification example 3-3 along with a circuit configuration example of an amplifier circuit 171A. FIG. 17 shows a circuit configuration of a pixel (pixel 20D) according to a modification example 3-4 along with a circuit configuration example of the amplifier circuit 171A. Unlike the pixels 20, 20A, and 20B that are described before, each of these pixels 20C and 20D has a so-called active-type pixel circuit.

On each of the pixels 20C and 20D, there are provided one photoelectric conversion device 21 and three transistors 23, 24, and 24. In addition to the readout control line Lread and the signal line Lsig, a reset control line Lrst is also connected with each of these pixels 20C and 20D.

On each of the pixels 20C and 20D, two gates of the transistor 22 are connected with the readout control lines Lread1 and Lread2 respectively, and a source thereof may be connected with, for example, the signal line Lsig, while a drain thereof may be connected with, for example, a drain of the transistor 23 configuring a source follower circuit. A source of the transistor 23 may be connected with, for example, a power supply VDD, and a gate thereof may be connected with, for example, a cathode (example in FIG. 16) or an anode (example in FIG. 17) of the photoelectric conversion device 21 as well as a drain of the transistor 24 functioning as a reset transistor via the accumulation node N for example. A gate of the transistor 24 is connected with the reset control line Lrst, and a reset voltage Vrst may be applied to a source thereof. In the modification example 3-3 in FIG. 16, an anode of the photoelectric conversion device 21 is connected with a ground (grounded), while in the modification example 3-4 in FIG. 17, a cathode of the photoelectric conversion device 21 is connected with a power supply terminal.

The amplifier circuit 171A is provided with a constant current source 171 and an amplifier 176 instead of the charge amplifier 172, the capacitor device C1, and the switch SW 1 on the above-described column selecting section 17. On the amplifier 176, the signal line Lsig is connected with a positive-side input terminal, while a negative-side input terminal and an output terminal are connected with one another to form a voltage follower circuit. It is to be noted that a first terminal of the constant current source 171 is connected with one end side of the signal line Lsig, while a power supply terminal VSS is connected with a second terminal of the constant current source 171.

In the image pickup unit having such active-type pixels 20C and 20D as well, it is possible to use the transistor 22 that is described in the above-described embodiment of the present disclosure as a readout transistor for example, which allows to suppress any shot noise or variation in the dark level. As a result, this makes it possible to achieve the same advantageous effect as the above-described embodiment of the present disclosure.

Modification Example 4-1

Figure 18A:
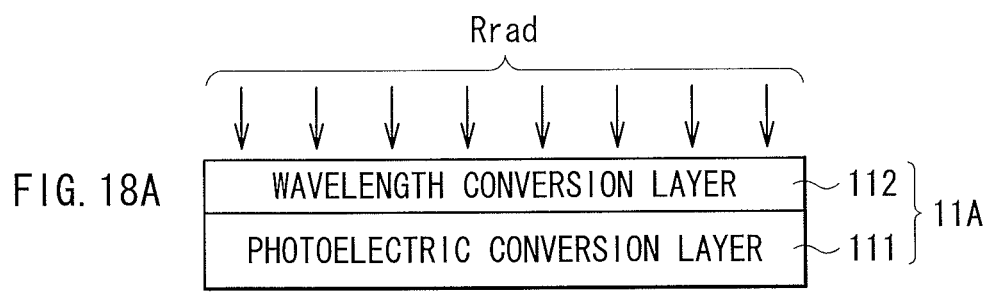

FIG. 18A schematically shows a simplified configuration of an image pickup section (image pickup section 11A) according to a modification example 4-1. The image pickup section 11A has a wavelength conversion layer 112 additionally on the photoelectric conversion layer 111 (optical receiving surface side) that is described in the above-described embodiments of the present disclosure. The wavelength conversion layer 112 performs a wavelength conversion of radiation ray Rrad (such as α-ray, β-ray, γ-ray, and X-ray) to allow the radiation ray Rrad to have a wavelength in a sensitivity range of the photoelectric conversion layer 111, making it possible to read information based on this radiation ray Rrad on the photoelectric conversion layer 111. The wavelength conversion layer 112 may be composed of, for example, a phosphor (such as scintillator) that converts radiation ray such as X-ray into visible light. Such a wavelength conversion layer 112 may be obtained in such a manner that, for example, a planarizing film composed of a material such as an organic planarizing film and spin-on-glass material is formed on the photoelectric conversion layer 111, and a phosphor film (such as CsI; Tl (CsI added with Tl), and $Gd_2O_2S$) is formed thereon. The image pickup section 11A may be applied to a so-called indirect-type radiographic image pickup unit for example.

Modification Example 4-2

Figure 18B:
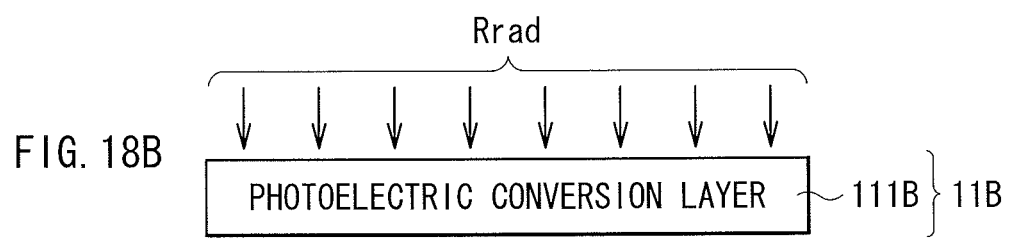
FIG. 18B is a schematic diagram showing a simplified configuration of an image pickup section according to a modification example 4-2.

FIG. 18B schematically shows a simplified configuration of an image pickup section (image pickup section 11B) according to a modification example 4-2. Unlike the above-described embodiment of the present disclosure, the image pickup section 11B has a photoelectric conversion layer 111B that converts incident radiation ray Rrad into an electric signal. The photoelectric conversion layer 111B may be composed of a material such as, for example, amorphous selenium (a-Se) semiconductor and cadmium tellurium (CdTe) semiconductor. The image pickup section 11B may be applied to a so-called direct-type radiographic image pickup unit for example.

The image pickup unit including any of the image pickup sections 11A and 11B according to the above-described modification examples 4-1 and 4-2 may be utilized as various types of radiographic image pickup units that obtain electric signals based on incident radiation ray Rrad. Possible applications of such radiographic image pickup units include, without limitation, a medical X-ray image pickup unit (such as a digital radiography), a portable-object inspection X-ray image pickup unit in use at airports and other places, and an industrial X-ray image pickup unit (such as an unit for inspection of dangerous objects in bulk containers and an unit for inspection of objects in bags).

Application Example

Each of the image pickup units according to the embodiment and modification examples of the present disclosure as described above may be applied to an image pickup display system as described hereinafter.

Figure 19:
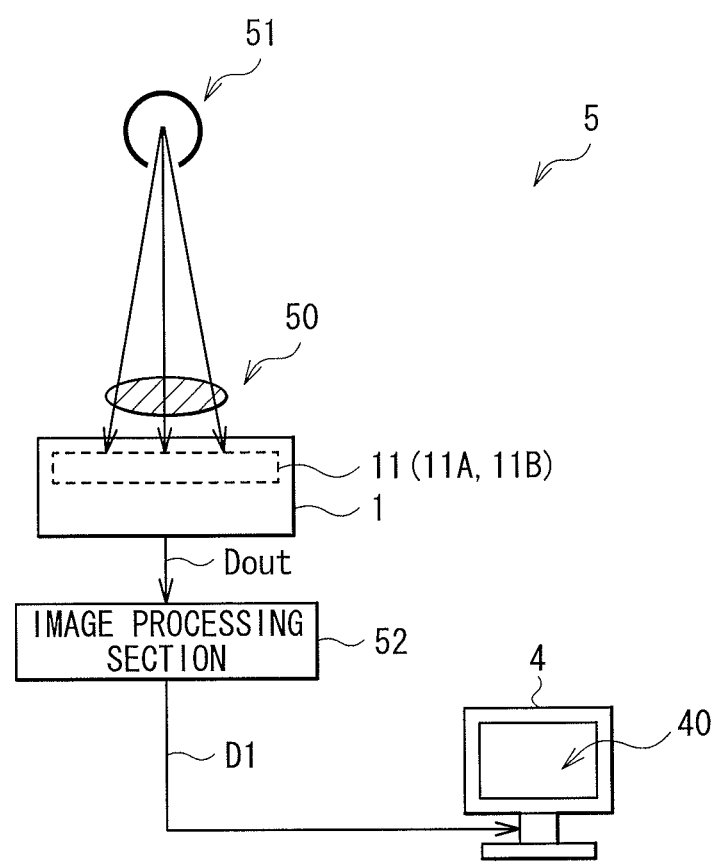
FIG. 19 is a schematic diagram showing a simplified configuration of an image pickup display system according to an application example.

FIG. 19 shows schematically a simplified configuration example of an image pickup display system (image pickup display system 5) according to an application example. The image pickup display system 5 may include the image pickup unit 1 having the above-described image pickup section 11 (or one of the image pickup sections 11A and 11B), an image processing section 52, and a display unit 4. The image pickup display system 5 may be an image pickup display system using radiation ray (radiographic image pickup display system) in this example.

The image processing section 52 generates image data D1 by performing a predetermined image processing for output data Dout (image pickup signal) that is output from the image pickup unit 1. The display unit 4 performs an image display on a predetermined monitor screen 40 based on the image data D1 generated on the image processing section 52.

In the image pickup display system 5, the image pickup unit 1 (radiographic image pickup unit here) obtains image data Dout of a subject 50 on the basis of irradiation light (radiation ray here) that is irradiated from a light source (radiation source such as X-ray source here) toward the subject 50 to output such data to the image processing section 52. The image processing section 52 performs the predetermined image processing as described above for the incoming image data Dout to output the image data (display data) D1 after the image processing to the display unit 4. The display unit 4 displays image information (pickup image) on the monitor screen 40 on the basis of the incoming image data D1.

As described above, in the image pickup display system 5 according to this application example, it is possible to obtain an image of the subject 50 as an electric signal on the image pickup unit 1, which allows an image display to be performed by transmitting the obtained electric signal to the display unit 4. In other words, it is possible to observe an image of the subject 50 without use of existing radiograph films, as well as to deal with both a motion image shooting and a motion image display.

It is to be noted that, in this application example, the description is provided with reference to a case where the image pickup unit 1 is configured as a radiographic image pickup to be an image pickup display system using radiation ray, although the image pickup display system according to the present technology is also applicable to any system using any other method.

The present technology is described with reference to the example embodiment, modification examples, and application example, although the present technology is not limited to the above-described embodiment, etc., of the present disclosure, but different variations are available. For example, the description is provided mainly on a case where either or both of the ends 126e1 and 126e2 on the channel layer 126a are exposed from the gate electrode 120B (the gate electrode 120B is made shorter in width than the gate electrode 120A), although a width size relation between the gate electrodes 120A and 120B may be a reverse thereof. More specifically, the ends 126e1 and 126e2 on the channel layer 126a may be only exposed from the gate electrodes 120A (the gate electrode 120A may be made shorter in width than the gate electrode 120B).

Further, in the above-described embodiment, etc., of the present disclosure, a case is described where the LDD layer is provided at both sides (source and drain sides) or one side (drain side) of the channel layer 126a on the semiconductor layer 126 as an example, although this LDD layer is not necessarily provided. In concrete terms, a configuration where the N+ layer 126c is formed adjacent to both sides of the channel layer 126a may be adopted alternatively. This configuration is useful especially when an amorphous silicon is used for the semiconductor layer 126. When a low-temperature polysilicon is used for the semiconductor layer 126, it is preferable, but not strictly necessary, to provide the LDD layer as described above.

Moreover, in the above-described embodiment, etc., of the present disclosure, a pixel circuit configuration in the image pickup section is not limited to that described in the above-described embodiment, etc., of the present disclosure (circuit configurations of pixels 20, 20A to 20D), but any other circuit configuration may be used. Similarly, circuit configurations of the row scanning section, the column selecting section, etc., are also not limited to that described in the above-described embodiment, etc., of the present disclosure, but any other circuit configuration may be permitted.

Further, some or all of the image pickup section, row scanning section, A/D conversion section (column selecting section), column scanning section, etc., that are described in the above-described embodiment, etc., of the present disclosure may be formed on the same substrate for example. In concrete terms, use of a polycrystalline semiconductor such as low-temperature polycrystalline silicon also allows switches, etc., in those circuit sections to be formed on the same substrate.

This makes it possible to perform a driving operation on the same substrate on the basis of a control signal from an external system control section for example, thereby allowing for reduction in size of a bezel (three-side-free frame structure) and improvement in reliability at the time of wiring connections.

Furthermore, the technology encompasses any possible combination of some or all of the various embodiments and the modifications described herein and incorporated herein.

Accordingly, it is possible to achieve at least the following configurations from the above-described example embodiments, the modifications, and the application examples of the disclosure.

(1) A device for image sensing comprising a plurality of pixels, each of which comprises:
 a photoelectric conversion unit configured to convert incident electromagnetic radiation into an electric signal; and
 at least one transistor comprising a first gate electrode and a second gate electrode above the first gate electrode, wherein,
  the first gate electrode and the second gate electrode do not overlap each other within a non-overlapping region.

(2) The device of (1), wherein the at least one transistor further comprises:
 a semiconductor layer between the first gate electrode and the second gate electrode;
 a source electrode electrically coupled to a first end of the semiconductor layer; and
 a drain electrode electrically coupled to a second end of the semiconductor layer.

(3) The device of (2), wherein the semiconductor layer comprises a channel layer having a first end toward the source electrode and a second end toward the drain electrode.

(4) The device of (3), wherein one of the first end and the second end of the channel layer is in the non-overlapping region.

(5) The device of (4), wherein one of the first end and the second end of the channel layer is not overlapped by one of the first gate electrode and the second gate electrode in the non-overlapping region.

(6) The device of (3), wherein:
 the non-overlapping region comprises a first non-overlapping region and a second non-overlapping region;
 the first end of the channel layer is in the first non-overlapping region; and
 the second end of the channel layer is in the second non-overlapping region.

(7) The device of (6), wherein:
 the first end of the channel layer is not overlapped by one of the first gate electrode and the second gate electrode in the first non-overlapping region; and
 the second end of the channel layer is not overlapped by one of the first gate electrode and the second gate electrode in the second non-overlapping region.

(8) The device of (1), wherein a width of the first gate electrode is equal to or larger than a width of the second gate electrode.

(9) The device of (3), wherein a capacitance between the first gate electrode and the channel layer is equal to or larger than a capacitance between the second gate electrode and the channel layer.

(10) The device of (3), wherein the semiconductor layer further comprises:
 a first active layer at the first end of the semiconductor layer and that is electrically coupled to the source electrode;

a second active layer at the second end of the semiconductor layer and that is electrically coupled to the drain electrode; and
a lightly-doped drain (LDD) layer between the channel layer and the second N+ layer.

(11) The device of (10), wherein the first active layer is a first N+ layer and the second active layer is a second N+ layer.

(12) The device of (2), wherein the at least one transistor further comprises:
a first gate insulating film between the first gate electrode and the semiconductor layer; and
a second gate insulating film between the second gate electrode and the semiconductor layer,
wherein,
the thickness of the first gate insulating film is smaller than the thickness of the second gate insulating film.

(13) The device of (1), wherein the at least one transistor comprises a first transistor and a second transistor that are electrically connected serially.

(14) The device of (1), wherein the electromagnetic radiation includes at least one of light in the x-ray spectrum and light in the visible spectrum.

(15) A system for display comprising:
a display unit configured to display an image based on a signal obtained by an image sensing device; and
the image sensing device comprising a plurality of pixels, each of which comprises (a) a photoelectric conversion unit and (b) at least one a transistor comprising a first gate electrode and a second gate electrode above the first gate electrode,
wherein,
the first gate electrode and the second gate electrode do not overlap each other within a non-overlapping region.

(16) The system of (15), wherein the at least one transistor further comprises:
a semiconductor layer between the first gate electrode and the second gate electrode;
a source electrode electrically coupled to a first end of the semiconductor layer; and
a drain electrode electrically coupled to a second end of the semiconductor layer.

(17) The system of (16), wherein the semiconductor layer comprises a channel layer having a first end toward the source electrode and a second end toward the drain electrode.

(18) The system of (17), wherein one of the first end and the second end of the channel layer is in the non-overlapping region.

(19) The system of (17), wherein:
the non-overlapping region comprises a first non-overlapping region and a second non-overlapping region;
the first end of the channel layer is in the first non-overlapping region; and
the second end of the channel layer is in the second non-overlapping region.

(20) A device for sensing radiation rays, the device comprising a plurality of pixels, each of which comprises:
a photoelectric conversion unit configured to convert incident x-ray radiation into an electric signal; and
at least one transistor comprising a first gate electrode and a second gate electrode above the first gate electrode,
wherein,
the first gate electrode and the second gate electrode do not overlap each other within a non-overlapping region.

(21) An image pickup unit, including:
a plurality of pixels each including a photoelectric conversion device and a field-effect transistor, the transistor including
a semiconductor layer,
a first gate electrode and a second gate electrode that are arranged in opposition to one another with the semiconductor layer interposed between,
a source electrode and a drain electrode that are electrically connected with the semiconductor layer, and
a non-overlapping region where the first gate electrode and the second gate electrode are not overlapped with one another in part.

(22) The image pickup unit according to (21), wherein
the semiconductor layer includes at least a channel layer having a first end and a second end, the first end being provided nearer to the source electrode than the drain electrode, and the second end being provided nearer to the drain electrode than the source electrode, and
the non-overlapping region is provided at a region corresponding to one of the first end and the second end, or at regions corresponding to the first end and the second end.

(23) The image pickup unit according to (22), wherein
the transistor further includes a first gate insulating film and a second gate insulating film,
the first gate electrode, the first gate insulating film, the semiconductor layer, the second gate insulating film, and the second gate electrode are laminated on a substrate in this order from the substrate, and
one or both of the first end and the second end of the channel layer is/are exposed from the second gate electrode in the non-overlapping region.

(24) The image pickup unit according to (23), wherein
the semiconductor layer further includes a lightly-doped drain layer that is adjacent to each of the first end and the second end of the channel layer, and
the first end of the channel layer is provided between the first gate electrode and the second gate electrode, and the second end is exposed from the second gate electrode.

(25) The image pickup unit according to (23), wherein
the semiconductor layer further includes a lightly-doped drain layer that is adjacent to each of the first end and the second end of the channel layer, and
both of the first end and the second end of the channel layer are exposed from the second gate electrode.

(26) The image pickup unit according to (23), wherein
the semiconductor layer further includes a lightly-doped drain layer that is adjacent to only the second end of the channel layer, and
the first end of the channel layer is provided between the first gate electrode and the second gate electrode, and the second end is exposed from the second gate electrode.

(27) The image pickup unit according to (23), wherein
the semiconductor layer further includes a lightly-doped drain layer that is adjacent to only the second end of the channel layer, and
both of the first end and the second end of the channel layer are exposed from the second gate electrode.

(28) The image pickup unit according to (22), wherein
the transistor further includes a first gate insulating film and a second gate insulating film,
the first gate electrode, the first gate insulating film, the semiconductor layer, the second gate insulating film, and the second gate electrode are laminated on a substrate in this order from the substrate, and one or both of the first end and the second end of the channel layer is/are exposed from the first gate electrode in the non-overlapping region.

(29) The image pickup unit according to (22), wherein
the transistor further includes a first gate insulating film and a second gate insulating film,
the first gate electrode, the first gate insulating film, the semiconductor layer, the second gate insulating film, and the second gate electrode are laminated on a substrate in this order from the substrate, and
one of the first end and the second end of the channel layer is exposed from the first gate electrode in the non-overlapping region, and the other of the first end and the second end of the channel layer is exposed from the second gate electrode in the non-overlapping region.

(30) The image pickup unit according to any one of (21) to (29), wherein the first gate electrode and the second gate electrode are different in width from one another.

(31) The image pickup unit according to any one of (21) to (30), wherein
the transistor further includes a first gate insulating film and a second gate insulating film,
the first gate electrode, the first gate insulating film, the semiconductor layer, the second gate insulating film, and the second gate electrode are laminated on a substrate in this order from the substrate, and
a capacitance between the first gate electrode and the semiconductor layer and a capacitance between the second gate electrode and the semiconductor layer are different from one another.

(32) The image pickup unit according to (31), wherein the capacitance between the second gate electrode and the semiconductor layer is smaller than the capacitance between the first gate electrode and the semiconductor layer.

(33) The image pickup unit according to (32), wherein a thickness of the second gate insulating film is greater than a thickness of the first gate insulating film.

(34) The image pickup unit according to any one of (21) to (33), wherein the semiconductor layer includes one of amorphous silicon, polysilicon, and microcrystalline silicon.

(35) The image pickup unit according to (34), wherein
the semiconductor layer includes low-temperature polysilicon, and
the transistor further includes a first gate insulating film and a second gate insulating film, each of the first gate insulating film and the second gate insulating film having a silicon oxide film.

(36) The image pickup unit according to any one of (21) to (35), wherein the photoelectric conversion device includes one of a PIN-type photodiode and an MIS-type sensor.

(37) The image pickup unit according to any one of (21) to (36), wherein each of the pixels generates an electric signal based on incident radiation ray.

(38) The image pickup unit according to any one of (21) to (37), wherein each of the pixels includes a wavelength conversion layer on the photoelectric conversion device, the wavelength conversion layer converting radiation ray to allow the radiation ray to have a wavelength in a sensitivity range of the photoelectric conversion device.

(39) The image pickup unit according to (38), wherein the radiation ray is X-ray.

(40) An image pickup display system with an image pickup unit and a display unit that performs image display based on an image pickup signal obtained by the image pickup unit, the image pickup unit including:

a plurality of pixels each including a photoelectric conversion device and a field-effect transistor, the transistor including
a semiconductor layer,
a first gate electrode and a second gate electrode that are arranged in opposition to one another with the semiconductor layer interposed between,
a source electrode and a drain electrode that are electrically connected with the semiconductor layer, and
a non-overlapping region where the first gate electrode and the second gate electrode are not overlapped with one another in part.

The present disclosure contains subject matter related to that disclosed in Japanese Priority Patent Application JP 2012-120551 filed in the Japan Patent Office on May 28, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A device for image sensing comprising a plurality of pixels, each of which comprises:
    a photoelectric conversion unit configured to convert incident electromagnetic radiation into an electric signal;
    at least one transistor comprising (a) a first gate electrode and a second gate electrode above the first gate electrode and (b) a semiconductor layer between the first gate electrode and the second gate electrode;
    a source electrode electrically coupled to a first end of the semiconductor layer;
    a drain electrode electrically coupled to a second end of the semiconductor layer, and
    a channel layer having a first end toward the source electrode and a second end toward the drain electrode,
    wherein,
        the first gate electrode and the second gate electrode do not overlap each other horizontally within a first non-overlapping region and a second non-overlapping region,
        the first end of the channel layer is within the first non-overlapping region, and
        the second end of the channel layer is within the second non-overlapping region.

2. The device of claim 1, wherein:
the first end of the channel layer is not overlapped by one of the first gate electrode and the second gate electrode in the first non-overlapping region; and
the second end of the channel layer is not overlapped by one of the first gate electrode and the second gate electrode in the second non-overlapping region.

3. The device of claim 1, wherein a capacitance between the first gate electrode and the channel layer is equal to or larger than a capacitance between the second gate electrode and the channel layer.

4. The device of claim 1, wherein the semiconductor layer further comprises:
    a first active layer at the first end of the semiconductor layer and that is electrically coupled to the source electrode;
    a second active layer at the second end of the semiconductor layer and that is electrically coupled to the drain electrode; and
    a lightly-doped drain (LDD) layer between the channel layer and the second active layer.

5. The device of claim 4, wherein the first active layer is a first N+ layer and the second active layer is a second N+ layer.

6. The device of claim 1, wherein the at least one transistor further comprises:
- a first gate insulating film between the first gate electrode and the semiconductor layer; and
- a second gate insulating film between the second gate electrode and the semiconductor layer, wherein,
- the thickness of the first gate insulating film is smaller than the thickness of the second gate insulating film.

7. The device of claim 1, wherein the at least one transistor comprises a first transistor and a second transistor that are electrically connected serially.

8. The device of claim 1, wherein the electromagnetic radiation includes at least one of light in the x-ray spectrum and light in the visible spectrum.

9. A system for display comprising:
- a display unit configured to display an image based on a signal obtained by an image sensing device; and
- the image sensing device comprising a plurality of pixels, each of which comprises (a) a photoelectric conversion unit (b) at least one transistor comprising a first gate electrode and a second gate electrode above the first gate electrode, (c) a semiconductor layer between the first gate electrode and the second gate electrode, (d) a source electrode electrically coupled to a first end of the semiconductor layer, (e) a drain electrode electrically coupled to a second end of the semiconductor layer, and (f) a channel layer having a first end toward the source electrode and a second end toward the drain electrode, wherein,
- the first gate electrode and the second gate electrode do not overlap each other horizontally within a first non-overlapping region and a second non-overlapping region,
- the first end of the channel layer is within the first non-overlapping region, and
- the second end of the channel layer is within the second non-overlapping region.

10. A device for sensing radiation rays, the device comprising a plurality of pixels, each of which comprises:
- a photoelectric conversion unit configured to convert incident x-ray radiation into an electric signal; and
- at least one transistor comprising (a) a first gate electrode and a second gate electrode above the first gate electrode, and (b) a semiconductor layer between the first gate electrode and the second gate electrode;
- a source electrode electrically coupled to a first end of the semiconductor layer;
- a drain electrode electrically coupled to a second end of the semiconductor layer, and
- a channel layer having a first end toward the source electrode and a second end toward the drain electrode, wherein,
- the first gate electrode and the second gate electrode do not overlap each other horizontally within a first non-overlapping region and a second non-overlapping region,
- the first end of the channel layer is within the first non-overlapping region, and
- the second end of the channel layer is within the second non-overlapping region.

* * * * *